United States Patent [19]

Theofanopoulos et al.

[11] Patent Number: 6,008,652

[45] Date of Patent: *Dec. 28, 1999

[54] BATTERY TUB TESTER

[75] Inventors: John Theofanopoulos; Erik J. Hansen, both of Auburn Hills, Mich.

[73] Assignee: Chrysler Corporation, Auburn Hills, Mich.

[*] Notice: This patent issued on a continued prosecution application filed under 37 CFR 1.53(d), and is subject to the twenty year patent term provisions of 35 U.S.C. 154(a)(2).

[21] Appl. No.: 09/023,966

[22] Filed: Feb. 13, 1998

[51] Int. Cl.[6] .................................................. H01M 10/46
[52] U.S. Cl. ...................... 324/434; 324/431; 324/433; 324/437; 324/429; 320/106; 340/636
[58] Field of Search ........................... 340/636; 370/106, 370/DIG. 12; 324/434, 433, 431, 429, 430, 427, 437

[56] References Cited

U.S. PATENT DOCUMENTS

| | | | |
|---|---|---|---|
| 4,849,682 | 7/1989 | Bauer | 320/21 |
| 5,548,200 | 8/1996 | Nor | 320/106 |
| 5,583,418 | 12/1996 | Honda | 320/106 |
| 5,592,069 | 1/1997 | Dias | 320/106 |
| 5,694,019 | 12/1997 | Uchida | 320/27 |
| 5,744,937 | 4/1998 | Cheon | 320/106 |

*Primary Examiner*—Josie Ballato
*Assistant Examiner*—Jose M. Solis
*Attorney, Agent, or Firm*—Mark P. Calcaterra

[57] ABSTRACT

A battery tub tester is disclosed that tests the individual batteries, battery accessories and connections as they are being assembled into a battery tub for an electric vehicle. The batteries and battery tub accessories, including temperature sensing devices and battery monitor modules, are mounted and electrically connected in the battery tub in accordance with a known battery tub assembly scheme. As the assembler mounts and connects the batteries and battery tub accessories, the tub tester determines the battery voltages of each battery after it is mounted and connected within the tub to determine if the batteries have the desirable voltage and will operate as they are intended and are connected properly. Additionally, the tester determines the temperature readings as the temperature sensors are being mounted, to determine if the temperature sensors will operate as intended and are connected properly. In this manner, the assembler will know that the battery tub is assembled properly and the components will operate properly prior to the battery tub being mounted to the vehicle.

19 Claims, 2 Drawing Sheets

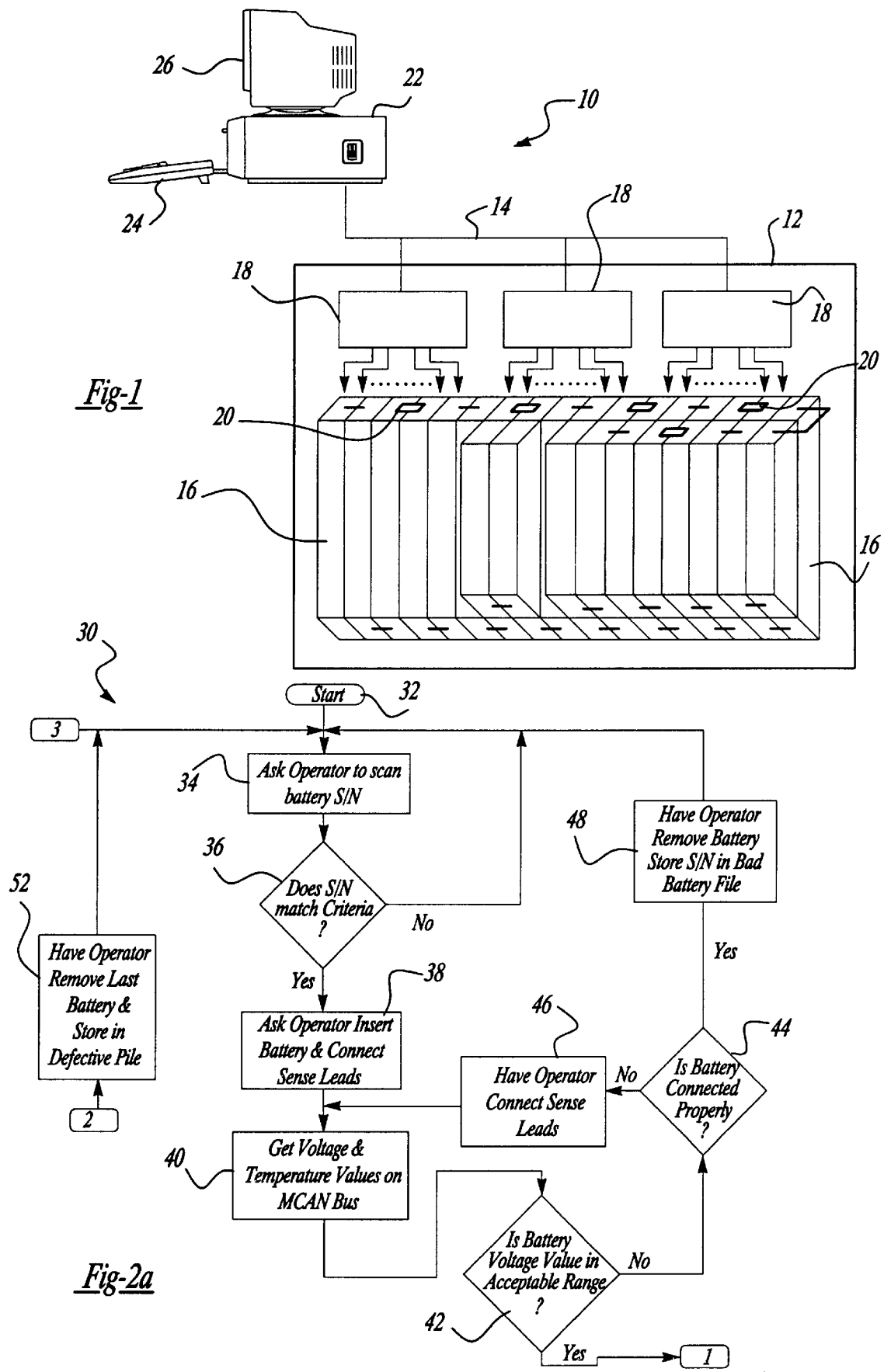

BATTERY TUB TESTER

BACKGROUND OF THE INVENTION

1. Field of the Invention

The present invention relates generally to a battery tub tester for testing battery tub components during tub assembly and, more particularly, to a battery monitor and tester for testing batteries and battery tub components as they are being assembled in a battery tub for an electric vehicle, to determine whether each individual battery and component is acceptable prior to the battery tub being connected to the vehicle.

2. Discussion of the Related Art

Electric vehicles which run on electrical power stored in multiple batteries within a battery housing or tub are known in the art. The popularity of electric vehicles is on the rise as a result of many factors including consumer demand, emission concerns with internal combustion engines and increased government regulations. An assembled battery tub includes a certain number of batteries and battery components mounted and electrically connected in the battery tub in accordance with a particular assembly scheme. Once assembled, a lid is bolted to the tub and the tub is then bolted to the vehicle.

In one example, twenty-seven 12 volt batteries, three battery monitor modules (BMMs), and fifteen temperature sensors (thermistors) are mounted and electrically connected within the battery tub. The batteries are electrically connected in series, and a group of batteries is connected to each BMM such that an electrical connection is made between each adjacent battery and the particular BMM. A single temperature sensor is used to sense the temperature of two adjacent batteries. During vehicle operation, the BMMs monitor the battery voltage and battery temperature of the individual batteries within the tub, and provide a signal indicative of these values to a controller to be processed for visual indication to a vehicle operator. U.S. Pat. No. 5,646,534 issued to Kopera discloses a battery monitor module for an electric vehicle of the type being discussed herein.

A problem exists with the above-described technique of assembling a battery tub for an electric vehicle. That problem has to do with the lack of ability, in the known art, to test the batteries, BMMs, and thermistors, and the various connections, as they are being assembled in the tub. Occasionally, one or more of the batteries being mounted and connected in the tub may be defective, and not be able to produce its intended charge. Additionally, it is typically necessary that the batteries all have approximately the same voltage capacity (generally on the order of 12–13½ volts) and voltage spread. Further, other tub components, such as the BMMs and the temperature sensors, may be defective and not operate properly. Also, the various connectors and leads may be defective or not connected properly, and not provide the desired electrical connections between the tub components.

Currently, no technique exists for determining whether the battery tub is being assembled properly, and whether the batteries and electrical components being inserted in the tub will operate as intended. Thus, the assembler of the tub would not know that the battery tub will not operate correctly until the battery tub was completely assembled, mounted to the vehicle, the vehicle was started, and the readouts from the BMMs were determined. After the battery tub was secured to the vehicle, and it was determined that there was some problem with the battery tub operation, it was necessary to remove the battery tub, and individually check each of the connections, batteries and other components to locate the problem. Because the battery tub is extremely heavy and is connected to the vehicle by several bolts, the manpower required to connect and remove the tub is intensive, as well as the manpower and lost time required to test the individual batteries and components once it has been removed.

What is needed is a system and method for sequentially testing the individual batteries, battery tub components and connections in a battery tub as the battery tub is being assembled, so as to insure that the battery tub will operate correctly prior to the tub being connected to the vehicle. It is therefore an object of the present invention to provide such a system and method.

SUMMARY OF THE INVENTION

In accordance with the teachings of the present invention, a battery tub tester is disclosed for testing the individual batteries, battery accessories and connections of a battery tub for an electric vehicle as the battery tub is being assembled. The batteries and battery tub accessories, including temperature sensing devices and battery monitor modules, are mounted and connected in the battery tub in accordance with a known battery tub assembly scheme. As the assembler mounts and connects the batteries and battery tub accessories, the tub tester determines the battery voltages of each battery after it is mounted and connected within the tub to determine if each battery has the desirable voltage, will operate as it was intended and is connected properly. Additionally, the tester determines the temperature readings of each temperature sensor as it is mounted in the tub, to determine if the temperature sensors will operate as intended and are connected properly. In this manner, the assembler will know that the battery tub is assembled properly and the components will operate as intended prior to the battery tub being mounted to the vehicle.

Additional objects, advantages and features of the present invention will become apparent from the following description and appended claims, taken in conjunction with the accompanying drawings.

BRIEF DESCRIPTION OF THE DRAWINGS

FIG. 1 is a schematic-type diagram of a battery tub tester connected to a battery tub for an electric vehicle for testing the battery tub's batteries, components and connections as they are being assembled in the tub, in accordance with the teachings of the present invention; and FIGS. 2(a) and 2(b) show a flow chart diagram of the process of testing the batteries and battery connections as they are being assembled in the battery tub according to an embodiment of the present invention.

DETAILED DESCRIPTION OF THE PREFERRED EMBODIMENTS

Figure 2B:
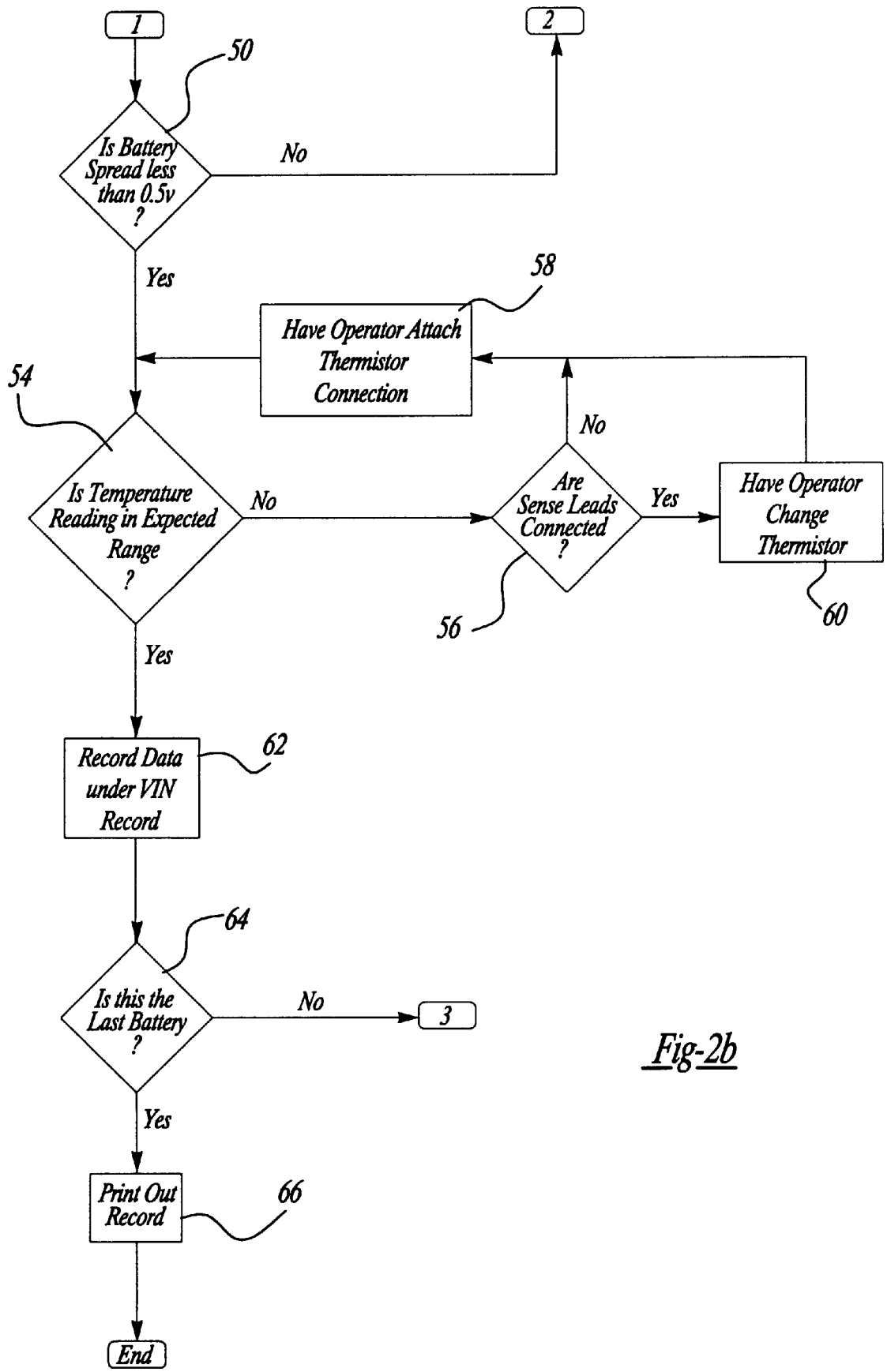

The following description of the preferred embodiments directed to a battery tub tester and method of testing batteries and battery tub components of the battery tub as it is being assembled is merely exemplary in nature, and is in no way intended to limit the invention or its applications or uses.

FIG. 1 is a schematic-type diagram of a battery tester 10 connected to a battery tub 12 by an electrical lead 14. Once assembled, the tub 12 is covered by a lid (not shown) and bolted to an electric vehicle (not shown). A plurality of stacked batteries 16, BMMs 18 and thermistors 20 are assembled, mounted and electrically connected within the battery tub 12 in accordance with a particular tub arrangement scheme. The arrangement of the batteries 16, the BMMs 18 and the thermistors 20 in the tub 12 is intended to depict all types of battery tub assemblies for electric vehicles.

The tester 10 is a computer system that includes a microprocessor 22, a keyboard 24, and a monitor screen 26. The computer system can be any suitable system for the purposes of the present invention. The tester 10 is programmed to operate in accordance with the testing scheme described below. The electrical lead 14 is intended to represent a plurality of electrical leads connected to the various BMMs 18 within the tub 12. When the tub 12 is connected to the vehicle, the electrical lead 14 is connected to a controller (not shown) within the vehicle that monitors the BMMs 18 during normal operation of the vehicle. The lead 14 is connected to the tester 10 during assembly of the tub 12 before each of the individual batteries 16 are mounted in the tub 12 and electrically connected to the BMMs 18. The operation of the BMMs 18, including the controller, is described, in one example, in the '534 patent.

FIG. 2 shows a flow chart diagram 30 depicting the operation of the tester 10 in accordance with a testing algorithm of the invention. The microprocessor 22 is programmed to prompt the tub assembler to perform certain functions while he is assembling the tub 12. The BMMs 18 are first mounted within the battery tub 12 in the conventional manner and then are connected to the tester 10 by the lead 14. The tester 10 is switched on, and the testing sequence is initiated to go through it's start-up routine at step 32. Each of the individual batteries 16 mounted within the tub 12 includes a plurality of bar codes (not shown). The plurality of bar codes give information such as the serial number of the battery 16, the manufacture date, the part number, etc. The first step that the testing algorithm prompts the assembler to do on the computer screen 26 is scan the appropriate bar code to determine the battery's serial number at step 34. The testing algorithm then determines if the scanned serial number matches the predetermined criteria stored in the tester 10, at decision diamond 36. The testing algorithm compares the scanned serial number to stored serial number data so as to eliminate certain errors, such as using the wrong battery type or double scans of the same battery. If the serial number does not match the predetermined criteria, the testing algorithm returns to the step 34 of prompting the assembler to scan the battery bar code.

If the serial number matches the predetermined criteria, then the testing algorithm prompts the assembler to insert the battery into the tub 12 and connect the sense leads of the appropriate BMM 18 to the positive and negative battery terminal connections in accordance with the tub assembly scheme, as indicated by step 38. At the appropriate time in the assembly scheme, the assembler will also connect a temperature sensor at this step. Once the sense leads of the battery and/or temperature sensor are connected, the testing algorithm determines the voltage and temperature values of the just connected battery or temperature sensor on a bus protocol, such as Motorola Component Area Network (MCAN) on the lead 14 through the BMM, at step 40. Next, the testing algorithm determines whether the measured battery voltage of the just installed battery has an acceptable voltage at decision diamond 42, so that the tester 10 knows that the battery will operate properly and be suitable for the tub 12. When the batteries are ready to be mounted in the tub 12, they are fully charged, and therefore, all of the batteries should have about the same voltage, for example, within a range of about 12.25 to 12.75 volts. It is important that all of the batteries in the tub 12 have about the same voltage capacity so that the charging and discharging of the batteries 16 during vehicle operation is as efficient as possible.

If the measured battery voltage, as determined at decision diamond 42, is not within the accepted range, then the testing algorithm prompts the assembler to visually inspect the battery connections to make sure that the battery is in fact connected properly at decision diamond 44. The battery connectors may be defective or the battery may not be connected properly, resulting in an improper voltage reading. If the battery is not connected properly or one or more of the connectors is broken, the testing algorithm prompts the assembler to attach the sense leads at step 46 to connect the battery properly, and then returns to the step of determining the battery voltage at step 40. If the battery is connected properly and the connectors are good at the decision diamond 44, the battery is not acceptable, and the testing algorithm prompts the assembler to remove the battery from the tub 12. The testing algorithm stores the serial number of the defective battery in a bad battery file in the microprocessor 22 at step 48. The testing algorithm then returns to the beginning of the algorithm for scanning and insertion of a new battery in the place of the defective battery at step 34.

If the testing algorithm determines that the measured voltage value of the battery has a value within the acceptable range at decision diamond 42, i.e., is fully charged to the right level, the algorithm then determines if the voltage range of all of the batteries mounted in the tub 12 so far have an acceptable voltage spread, here 0.5 volts, at decision diamond 50. Not only do the batteries have to be fully charged to an acceptable voltage level range, the fully charged battery voltage of each battery in the tub 12 must be within a certain value of every other battery in the tub 12 for proper operation of the tub 12. The actual voltage values that set the spread to determine if the most recently inserted battery falls within the spread are defined by the already mounted and accepted batteries. Of course, a spread of 0.5 volts is by way of example in that other voltage spreads may be applicable. If the voltage value of the battery is not within the accepted spread, the algorithm prompts the assembler to remove the last inserted battery at step 52 as being inadequate. Even though the battery does not have an acceptable voltage value compared to the other batteries already inserted, the battery may be able to be used for other applications. The algorithm then returns to the step 46.

If the voltage value of the battery is in the acceptable range, the testing algorithm then determines if the measured temperature is within an acceptable range, at decision diamond 54. The expected temperature range can be any predetermined range around ambient temperature, and as long as the temperature sensors are within this range, the connection of the thermistors is acceptable, and the thermistors are operating correctly. If the temperature measurement is not within the acceptable or expected range, then the testing algorithm prompts the assembler to determine if the thermistor sense leads are connected properly and the connectors are good at decision diamond 56. If the thermistor leads are not connected properly or the connectors are broken or defective, the testing algorithm prompts the assembler to properly attach or replace the thermistor leads at step 58, and then returns to decision diamond 50 to determine if the temperature measurement is now in the expected range. If the thermistor leads are connected properly and the temperature reading is not at the right level, then the thermistor is probably defective, and the testing algorithm prompts the assembler to change the thermistor at step 60, attach the new thermistor connection at the step 58, and then return to the decision diamond 54 to determine if the temperature measurement of the new thermistor is in the appropriate range.

If the thermistor is in the expected temperature range, then the testing algorithm records certain data, such as location of the batteries and thermistors inserted so far, under the vehicle identification number (VIN) at step 62, because all of the batteries and thermistors that have been assembled so far are suitable. This information is retained for warranty purposes. The testing algorithm then prompts the assembler to determine whether the last battery has been inserted in the battery tub 12 at decision diamond 64. If it is not the last battery, the algorithm returns to the step 34 to scan the next battery to determine its serial number. If it was the last battery, then the testing algorithm prints out a record of the assembly at step 66. At the end of the process, the assembler knows that all of the batteries, thermistors, BMMs and the connections therebetween are good, and once the battery tub 12 is bolted to the vehicle, will know that any problems will not be within the tub 12.

The foregoing discussion discloses and describes merely exemplary embodiments of the present invention. One skilled in the art will readily recognize from such discussion, and from the accompanying drawings and claims, that various changes, modifications and variations can be made therein without departing from the spirit and scope of the invention as defined in the following claims.

What is claimed is:

1. A method of testing the electrical performance of a battery tub for an electric vehicle while the tub is being assembled, said assembled battery tub including a plurality of batteries, a plurality of temperature sensing devices, and at least one battery monitor module, said batteries presumed to be in a full state of charge prior to being assembled in the tub, said method not including charging a battery if the battery is not in a full state of charge prior to being assembled, said method comprising the steps of:

determining an identification of a battery before it is assembled within the battery tub;

mounting the battery within the tub if the identification corresponds to predetermined criteria;

measuring the voltage of the battery after it is mounted within the tub, said step of measuring the battery voltage includes determining whether the battery has a measured battery voltage within an acceptable battery voltage range;

determining whether the battery is electrically connected properly if the measured battery voltage is not within the acceptable battery voltage range;

removing the battery from the tub if the battery is electrically connected properly and the battery voltage is not within the acceptable battery voltage range;

mounting a temperature sensor within the tub;

determining if a temperature measurement of the temperature sensing device is within an expected temperature range;

determining whether the temperature sensing device is properly connected if the temperature measurement is not within the expected temperature range; and separately repeating the foregoing steps for all of the batteries and temperature sensing devices in a predetermined sequence until all of the batteries and temperature sensing devices are assembled within the tub.

2. The method according to claim 1 wherein the step of measuring the voltage of the battery includes measuring the voltage of the battery immediately after it is mounted within the battery tub.

3. The method according to claim 1 further comprising the step of storing the battery identification in a bad battery file if the measured battery voltage is not within the acceptable battery voltage range and the battery is connected properly.

4. The method according to claim 1 further comprising the step of removing a last mounted battery and mounting a new battery if the last mounted battery is not within the acceptable battery voltage range.

5. The method according to claim 1 further comprising the step of removing a last mounted temperature sensing device and mounting a new temperature sensing device if the temperature measurement of the last mounted sensing device is not within the expected temperature range.

6. The method according to claim 1 further comprising the step of determining if the measured voltage value of a last mounted battery is within a predetermined voltage spread, said voltage spread being defined by the measured voltage values of all of the previously mounted and measured batteries.

7. The method according to claim 6 wherein the voltage spread is 0.5 volts.

8. The method according to claim 1 further comprising the step of storing battery and temperature sensor identification information under a vehicle number if the measured battery voltage and temperature values are acceptable.

9. A method of testing the electrical performance of batteries mounted in a battery tub of an electric vehicle as the batteries are being assembled in the tub, said batteries presumed to be in a full state of charge prior to being assembled in the tub, said method not including charging a battery if the battery is not in a full state of charge prior to being assembled, said method comprising the steps of:

determining an identification of a current battery before it is assembled within the battery tub;

mounting the battery within the battery tub if the identification corresponds to predetermined criteria;

measuring the voltage of the battery after it is mounted within the tub, said step of measuring the battery voltage includes determining whether the battery has a measured battery voltage within an acceptable battery voltage range;

determining whether the battery is electrically connected properly if the measured battery voltage is not within the acceptable battery voltage range;

removing the battery from the tub if the battery is electrically connected properly and the battery voltage is not within the acceptable battery voltage range; and repeating the steps of determining an identification, mounting the battery, measuring the voltage of the battery, and determining whether the battery is electrically connected properly for a next battery that is to be assembled in the tub if the current battery has a measured battery voltage within the acceptable battery voltage range.

10. The method according to claim 9 further comprising the step of determining if the measured voltage value of a last mounted battery is within a predetermined voltage spread, said predetermined voltage spread being defined by the measured voltage values of all of the previously mounted and measured batteries.

11. The method according to claim 9 further comprising the step of removing a last mounted battery and mounting a new battery if the last mounted battery is not within the acceptable battery voltage range.

12. The method according to claim 9 further comprising the step of storing the battery identification in a bad battery file if the measured battery voltage is not within the acceptable battery voltage range and the battery is connected properly.

13. An apparatus for determining the electrical performance of a battery tub for an electric vehicle while the tub is being assembled prior to the battery tub being connected to the vehicle, said battery tub including a plurality of batteries, a plurality of temperature sensing devices, and at least one battery monitor module, said batteries presumed to be in a full state of charge prior to being assembled in the tub, said apparatus being unable to charge a battery if the battery is not in a full state of charge prior to being assembled, said apparatus comprising:

- a system for separately determining an identification of each battery before it is mounted within the battery tub;
- a system for measuring the voltage of the battery after it is mounted within the battery tub prior to a next battery being mounted in the tub, said system for measuring the battery voltage determining whether the battery has a measured battery voltage within an acceptable battery voltage range; and
- a system for determining a temperature measurement of a temperature sensing device after it is mounted within the battery tub, said system for determining a temperature measurement determining if the temperature measurement is within an expected temperature range.

14. The apparatus according to claim 13 wherein the system for determining an identification, the system for measuring the voltage, and the system for determining a temperature measurement are all being electrically connected to the at least one battery monitor module mounted within the battery tub.

15. The apparatus according to claim 13 wherein the apparatus is a computer system, said computer system including a screen that displays prompts to an assembler of the performance of the apparatus.

16. The apparatus according to claim 15 wherein the screen displays a prompt for determining whether the battery is electrically connected properly if the measured battery voltage is not within the acceptable battery voltage range and a prompt for determining whether the temperature sensing device is connected properly if the temperature measurement is not within the expected temperature range.

17. The apparatus according to claim 13 further comprising a system for storing the battery identification in a bad battery file if the measured battery voltage is not within the acceptable battery voltage range.

18. The apparatus according to claim 13 wherein the system for measuring the voltage of the battery further determines if the measured voltage value of the battery is within a predetermined voltage spread, said voltage spread being defined by the measured voltage values of all of the previously mounted and measured batteries within the tub.

19. The apparatus according to claim 13 further comprising a system for storing battery and temperature sensor identification information under a vehicle number if the measured battery voltage and temperature sensing device values are acceptable.

* * * * *